United States Patent [19]
Tribbey et al.

[11] Patent Number: 5,311,405
[45] Date of Patent: May 10, 1994

[54] METHOD AND APPARATUS FOR ALIGNING AND ATTACHING A SURFACE MOUNT COMPONENT

[75] Inventors: David A. Tribbey, Boynton Beach; Henry F. Liebman, Tamarac; Allen D. Hertz, Boca Raton; Peter E. Albertson, Cooper City, all of Fla.

[73] Assignee: Motorola, Inc., Schaumburg, Ill.

[21] Appl. No.: 100,834

[22] Filed: Aug. 2, 1993

[51] Int. Cl.⁵ .............................................. H05K 7/10
[52] U.S. Cl. .................................... 361/767; 361/748; 361/765; 174/52.1; 174/259; 174/263; 257/676; 257/698
[58] Field of Search ............... 361/743, 748, 760, 761, 361/765, 767, 807, 808; 174/52.1, 52.3, 52.4, 259, 263; 257/676, 698

[56] References Cited

U.S. PATENT DOCUMENTS 4,164,778  8/1979  Sawairi et al.

FOREIGN PATENT DOCUMENTS

| 0186818A | 7/1986 | European Pat. Off. ............ 257/698 |
| 2732529 | 7/1977 | Fed. Rep. of Germany . |
| 8178529A | 10/1983 | Japan .................................. 257/676 |
| 0137041A | 7/1985 | Japan .................................. 257/676 |
| 1-95589 | 4/1989 | Japan . |
| 0303781 | 12/1989 | Japan .................................. 439/77 |

Primary Examiner—Leo P. Picard
Assistant Examiner—Young Whang
Attorney, Agent, or Firm—R. Louis Breeden; Thomas G. Berry

[57] ABSTRACT

A method and an apparatus align and attach a leadless surface mount component (402) including a termination at each end of the component (402). The termination has bottom (704) and end (702) portions for attaching to a corresponding pad on a substrate (102) by a reflow solder process (1200). A pad arrangement (100) is formed including two opposite pads (108), each pad (108) occupying a tri-oval-shaped area. The tri-oval-shaped area includes an elliptical area (110) substantially centered under the bottom portion (704) of the corresponding termination of the component (402) when the component (402) is aligned with the pad arrangement (100), and an arcuate area (112) contiguous with the elliptical area (110) and extending towards the opposite pad (108) in a central lengthwise direction. A solder paste (202) is applied to the elliptical area (110), and thereafter reflowed, whereby solder (302) in the solder paste (202) liquefies and flows onto the arcuate area (112), thereby facilitating alignment of the component (402) with the pad arrangement (100).

12 Claims, 7 Drawing Sheets

METHOD AND APPARATUS FOR ALIGNING AND ATTACHING A SURFACE MOUNT COMPONENT

FIELD OF THE INVENTION

This invention relates in general to a method and apparatus for mounting electronic components to a substrate, and more specifically to a method and apparatus for aligning and attaching surface mount components to substrate mounting pads.

BACKGROUND OF THE INVENTION

There are many well-known methods of mounting electronic components to a substrate. One method is the conventional "reflow soldering" process used for attaching terminations of surface mount components. In the conventional reflow soldering process the terminations of the surface mount components have a thin pre-tin solder coating and are attached during a manufacturing process to rectangular mounting pads etched onto a substrate. The process comprises printing a solder paste through a stencil having apertures matching the size and location of the mounting pads, placing the surface mount component terminations on top of the solder paste in alignment with the mounting pads therefor, and passing the substrate and surface mount components through a reflow solder oven for heating the pre-tin solder coating and solder paste to a liquefied state to attach the terminations to the mounting pads.

Disadvantageously, during the conventional reflow soldering process, termination attachment defects occur because the terminations of the surface mount components do not always remain aligned with the mounting pads. Errors in initial placement of the surface mount components, vibrations from equipment used to move the substrate through a manufacturing area, and general handling also can cause misalignment. Unfortunately, the mounting pads used in the conventional process are only partially effective in correcting any misalignment that occurs.

The trend of electronic devices, such as selective call receivers, towards smaller sizes requiring micro-miniature components tends to increase defect rates even further in the conventional reflow soldering process. This is because the defect rate due to misalignment increases as the terminations, mounting pads, and alignment tolerances become more critical.

Thus, what is needed is a better way of mounting surface mount components to corresponding mounting pads on a substrate. A method and apparatus that can minimize component misalignment and reduce attachment defects on microminiature components is highly desired.

SUMMARY OF THE INVENTION

One aspect of the present invention is a method of aligning and attaching a leadless surface mount component comprising a termination at each end of the component. The termination has bottom and end portions for attaching to a corresponding pad on a substrate by a reflow process of liquefying and subsequently solidifying a conductive material positioned between the termination and the pad. The method comprises the step of forming a pad arrangement comprising two opposite pads, each pad occupying a tri-oval-shaped area. The tri-oval-shaped area comprises an elliptical area substantially centered under the bottom portion of the corresponding termination of the component when the component is aligned with the pad arrangement, and an arcuate area contiguous with the elliptical area and extending towards the opposite pad in a central lengthwise direction. The method further comprises the step of applying the conductive material to the elliptical area, and thereafter performing the reflow process, whereby the conductive material liquefies and flows onto the arcuate area, thereby facilitating alignment of the component with the pad arrangement.

Another aspect of the present invention is a method of increasing and better directing surface tension utilized for aligning a leadless surface mount component comprising a termination at each end of the component. The termination has bottom and end portions for attaching to a corresponding pad on a substrate by a reflow process of liquefying and subsequently solidifying a conductive material positioned between the termination and the pad. The method comprises the step of forming a pad arrangement having a center and comprising two opposite pads positioned on either side of the center. Each pad occupies a tri-oval-shaped area comprising an elliptical area having a center substantially centered under the bottom portion of the corresponding termination of the component when the component is aligned with the pad arrangement, and an arcuate area contiguous with the elliptical area and extending towards the opposite pad in a central lengthwise direction. The method further comprises the step of applying the conductive material to the elliptical area, and thereafter performing the reflow process, whereby the conductive material liquefies and flows onto the arcuate area, losing thickness and thereby increasing the surface tension of the liquefied conductive material.

Another aspect of the present invention is a pad arrangement for aligning and attaching a leadless surface mount component comprising a termination at each end of the component. The termination has bottom and end portions. The pad arrangement is for interconnecting the surface mount component with other circuitry and comprises a substrate for supporting and interconnecting the surface mount component with the other circuitry, and two opposite pads formed on the substrate and interconnected with the other circuitry. Each pad occupies a tri-oval-shaped area comprising an elliptical area substantially centered under the bottom portion of the corresponding termination of the component when the component is aligned with the pad arrangement, and an arcuate area contiguous with the elliptical area and extending towards the opposite pad in a central lengthwise direction. The pad arrangement further comprises a conductive material applied to the elliptical area and thereafter reflowed onto the arcuate area, thereby facilitating alignment of the component with the pad arrangement.

DESCRIPTION OF THE PREFERRED EMBODIMENT

Figure 1:
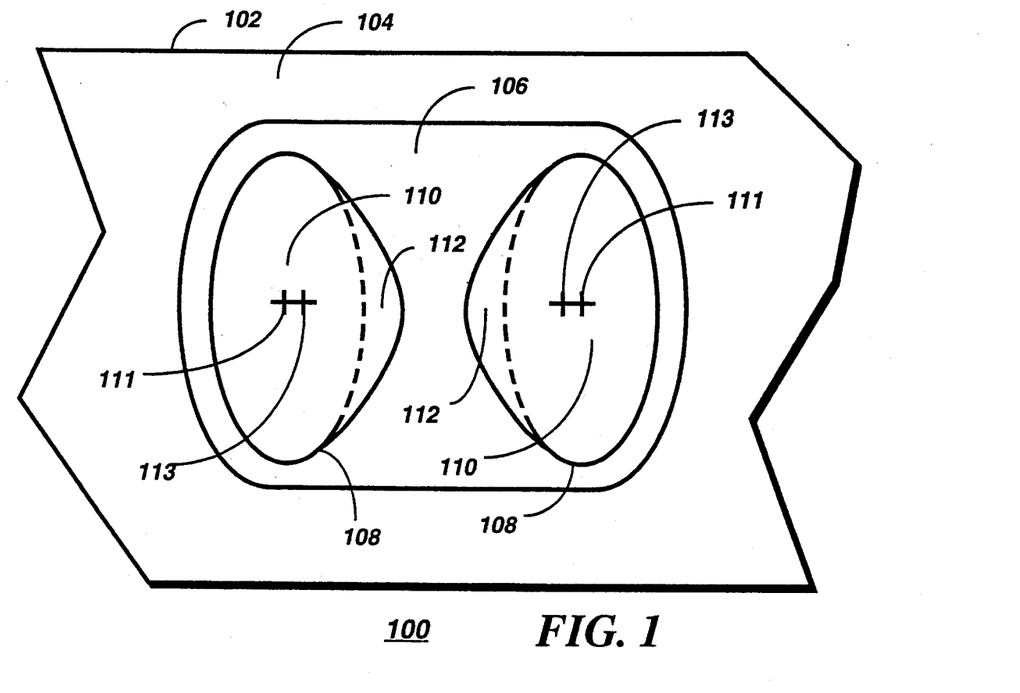
FIG. 1 is a top orthographic view of a pad arrangement in accordance with the preferred embodiment of the present invention.

Referring to FIG. 1, a top orthographic view depicts a pad arrangement 100 in accordance with the preferred embodiment of the present invention comprising a substrate 102 and two tri-oval pads 108. The substrate 102 has a protective coating 104 (solder resist), which has been removed from the tri-oval pads 108 to allow further processing of the pads 108. The protective coating 104 is also removed from between the pads 108 and from a pad surround area 106 to allow free movement of a surface mount component 402 (FIG. 4) for realignment during reflow soldering, as will be described herein below. Each tri-oval pad 108 comprises an elliptical area 110 having a first centroid 111 and an arcuate area 112 contiguous with the elliptical area 110. Each tri-oval pad 108 has a second centroid 113, the second centroid being positioned closer to the center of the pad arrangement 100 than is the first centroid 111.

Preferably, the substrate 102 comprises a glass filled epoxy material, such as FR4 filled epoxy, and the protective coating 104 comprises a thermally cured wet-film resist, such as Probimer TM, manufactured by Ciba-Geigy Corporation of Terry Town, N.Y. Preferably, the tri-oval pads are formed of copper coated with a tin-lead alloy. It will be appreciated that similar alternative materials may be utilized for the substrate 102, the protective coating 104, and the tri-oval pads 108.

Figure 2:
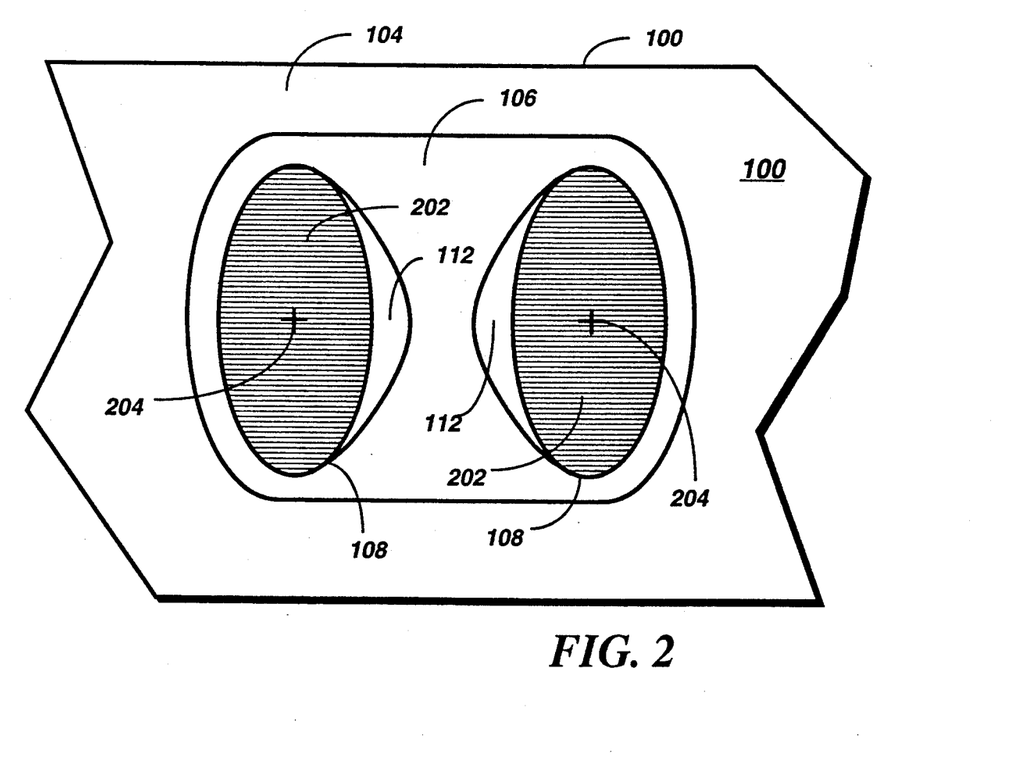
FIG. 2 is a top orthographic view of the pad arrangement after solder paste is applied in accordance with the preferred embodiment of the present invention.

Referring to FIG. 2, a top orthographic view depicts the pad arrangement 100 after a solder paste 202 is applied using a stencil to limit the solder paste 202 to only to the elliptical areas 110 of the tri-oval pads 108 in accordance with the preferred embodiment of the present invention. The solder paste 202 is applied evenly, such that the centroid 204 of the solder paste is substantially centered over the first centroid 111 of the elliptical area 110 after the application. Preferably, the solder paste 202 is a fine pitch solder paste, such as Kester 247B, manufactured by Kester Solder Division, Litton Systems, Inc., of Des Plaines, Ill., applied to the elliptical areas 110 by printing through an six-mil (0.15 mm) stainless steel stencil (not shown) having elliptical openings corresponding to the elliptical areas 110. It will be appreciated that other materials may be used for the solder paste 202 and the stencil, and that other thicknesses of stencil also may be used, depending upon the component size and component termination size, and the pad sizes.

Figure 3:
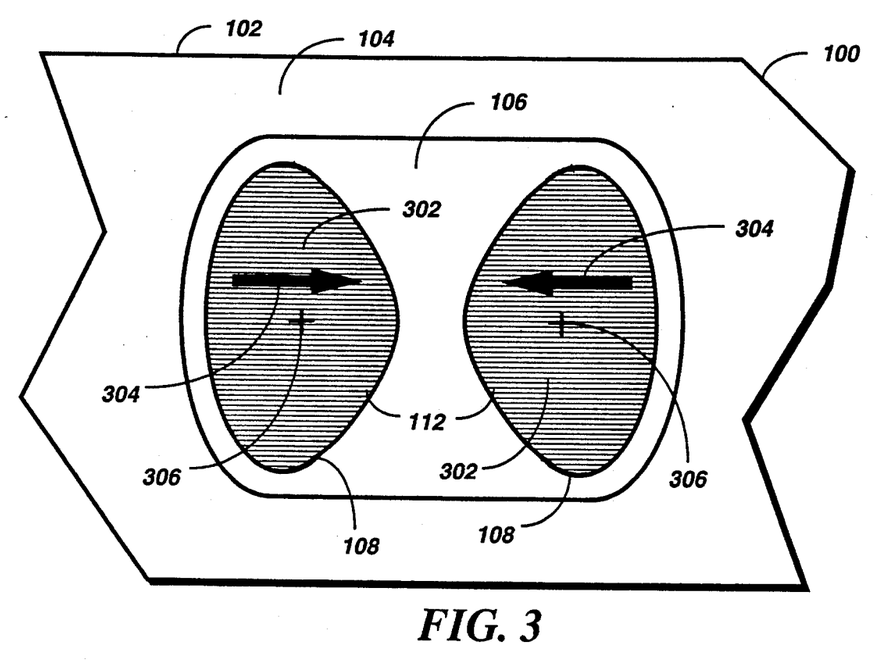
FIG. 3 is a top orthographic view of the pad arrangement after reflow soldering in accordance with the preferred embodiment of the present invention.

Referring to FIG. 3, a top orthographic view depicts the pad arrangement 100 after reflow soldering in accordance with the preferred embodiment of the present invention. In this view, solder 302 in the solder paste 202 has liquefied and has flowed onto the arcuate area 112, moving the centroid 306 of the solder 302 in the direction of the arrows 304 on each of the pads 108, to a position substantially over the second centroid 113 of the tri-oval pad 108. It will be appreciated that at this point that alternative reflow processes, such as solid solder deposition can be applied. The solid solder deposition reflow process utilizes solid solder, predeposited onto the tri-oval pads 108, flux deposited on each reflowable joint on the substrate 102, with subsequent surface mount component attachment during reflow. However, as will be explained herein below in accordance with the preferred reflow process, the movement of the solder 302 onto the arcuate area 112 is beneficial to the alignment of a surface mount component 402 (FIG. 4) being attached to the pad arrangement 100 during the reflow soldering process.

Figure 4:
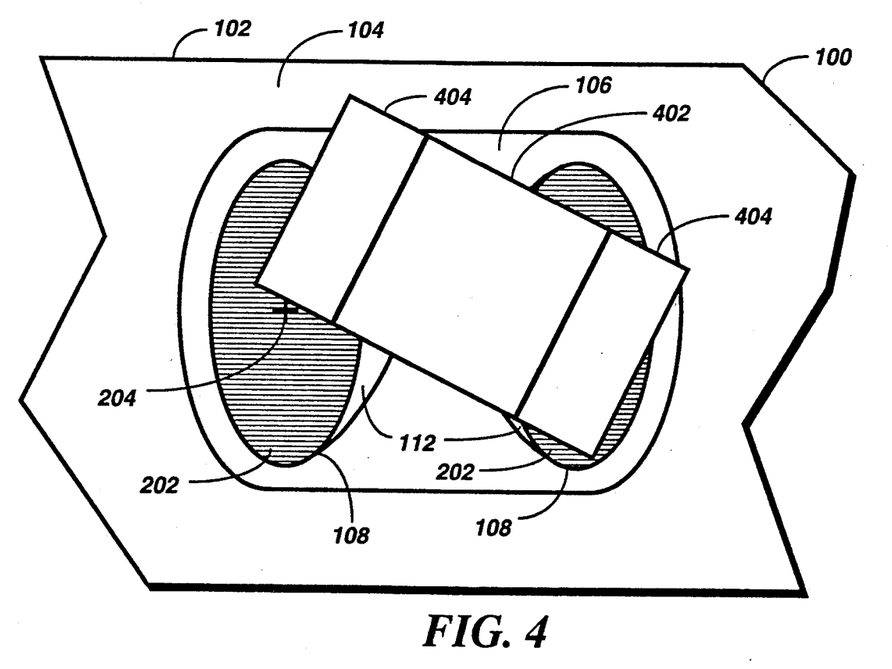
FIG. 4 is a top orthographic view of the pad arrangement and a surface mount component before reflow soldering in accordance with the preferred embodiment of the present invention.
Figure 5:
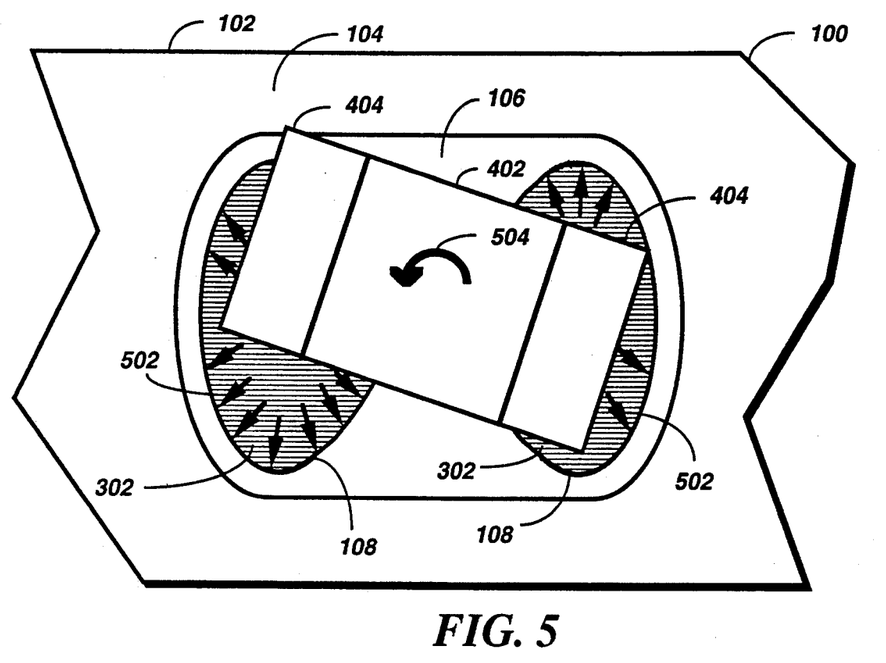
FIG. 5 is a top orthographic view of the pad arrangement and the surface mount component during reflow soldering in accordance with the preferred embodiment of the present invention.
Figure 6:
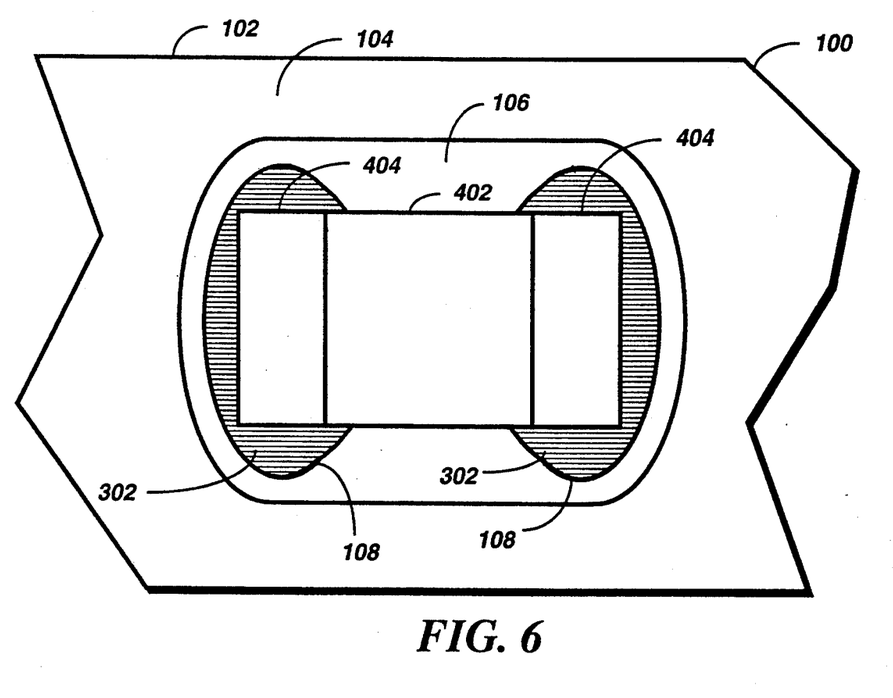
FIG. 6 is a top orthographic view of the pad arrangement and the surface mount component after reflow soldering in accordance with the preferred embodiment of the present invention.

Referring to FIGS. 4, 5 and 6, top orthographic views depict the pad arrangement 100 and the surface mount component 402 before, during, and after reflow soldering, respectively, in accordance with the preferred embodiment of the present invention. In FIG. 4, terminations 404 of the surface mount component 402 are depicted as grossly misaligned with respect to the two tri-oval pads 108 of the pad arrangement 100. In FIG. 5, during the reflow soldering process, the solder 302 is liquefied by heat, and flows onto the terminations 404 and onto the arcuate area 112, thereby generating movement and increasing surface tension forces 502, which tend to rotate the surface mount component 402 in the direction indicated by the curved arrow 504. In FIG. 6, after the reflow soldering process, the surface mount component 402 has been pulled into alignment with the pad arrangement 100 by the surface tension forces 502 and movement of the solder 302 when the solder 302 was liquefied and resolidified during the reflow solder process.

Figure 7:
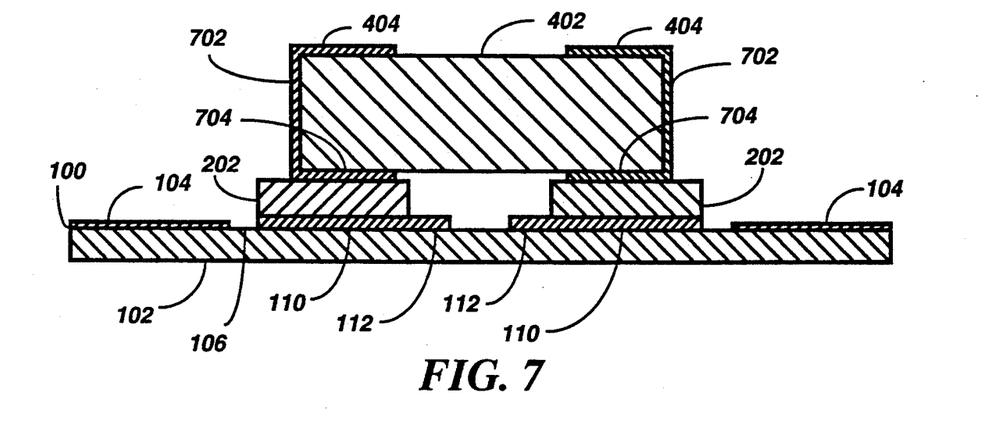
FIG. 7 is a side orthographic longitudinal cross-section view of the pad arrangement and the surface mount component prior to reflow soldering in accordance with the preferred embodiment of the present invention.
Figure 8:
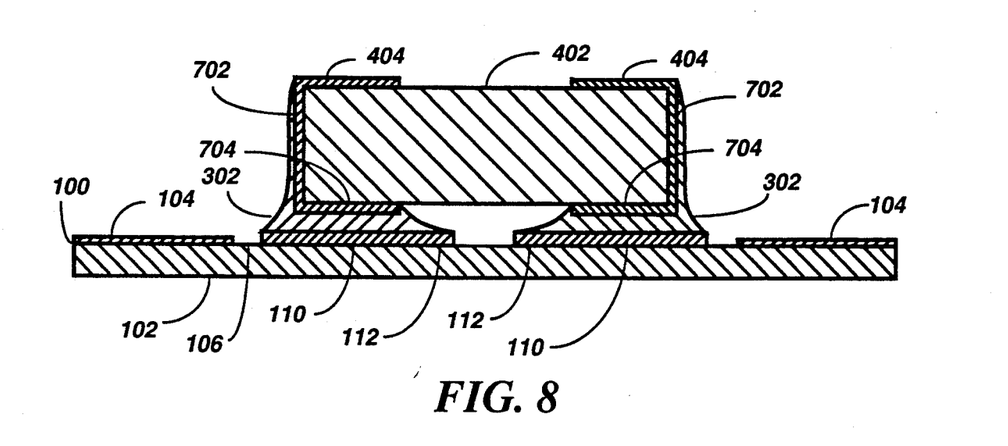
FIG. 8 is a side orthographic longitudinal cross-section view of the pad arrangement and the surface mount component during reflow soldering in accordance with the preferred embodiment of the present invention.
Figure 9:
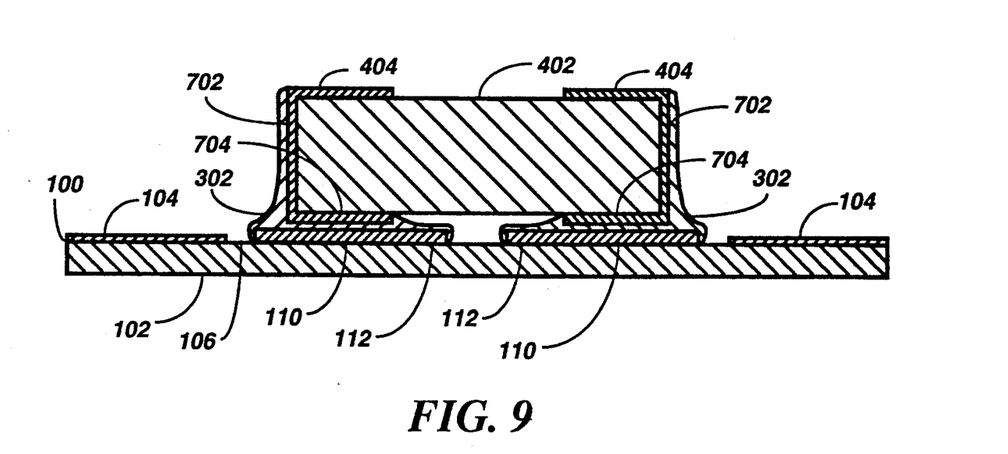
FIG. 9 is a side orthographic longitudinal cross-section view of the pad arrangement and the surface mount component after reflow soldering in accordance with the preferred embodiment of the present invention.

Referring to FIGS. 7, 8, and 9, side orthographic longitudinal cross-section views depict the pad arrangement 100 and the surface mount component 402 before, during, and after reflow soldering, respectively, in accordance with the preferred embodiment of the present invention. In FIG. 7, ends 702 and bottoms 704 of the terminations 404 are shown resting on the solder paste 202, which preferably has been printed onto only the elliptical areas 110 of the tri-oval pads 108. In FIG. 8 the solder paste has melted, forming the solder 302, which is in a liquefied state. The solder 302 is shown having moved onto the arcuate areas 112 of the tri-oval pads 108, and also partially adhering to the terminations 404 of the surface mount component 402. The movement of the solder 302 onto the arcuate areas 112 reduces the thickness of the solder 302, thereby increasing the surface tension of the solder, and thus increasing the forces tending to align the surface mount component 402 with the pad arrangement 100. In FIG. 9, the solder 302 substantially adheres to the terminations 404 and the tri-oval pads 108. The resolidified upper surfaces of the solder 302 proximate the tri-oval pads 108 are concave in shape—evidence that an increased level of surface tension has occurred for aligning the surface mount component 402 during the reflow soldering process.

A side advantage provided by the arcuate areas 112 is an increase in the tolerance window for placing the surface mount component without deleterious effects. This result is due to the inherently higher accuracy of the process for forming the pad arrangement 100 compared to the accuracy of printing the solder paste 202. In other words, the arcuate areas 112 can be placed closer to one another without causing an electrical short than would be possible if the entire pad arrangement were to be printed with the solder paste 202. The closer placement of the arcuate areas provides a larger area of liquid solder for contacting and aligning a component 402 that has become misaligned prior to the reflow soldering process.

Figure 10:
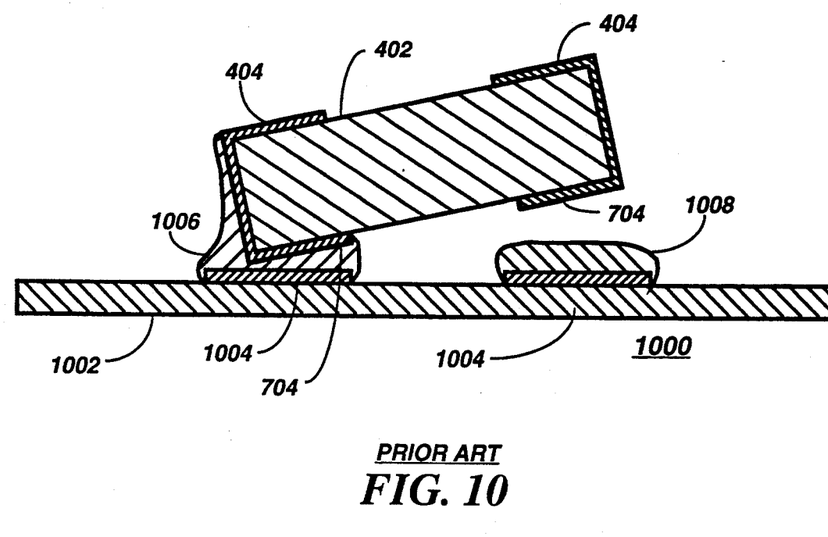
FIG. 10 is a side orthographic longitudinal cross-section view of a tombstoned surface mount component after reflow soldering utilizing a conventional pad arrangement.

Referring to FIG. 10, a side orthographic longitudinal cross-section view depicts a "tombstoned," i.e., up-ended, surface mount component 402 after reflow soldering utilizing a conventional pad arrangement 1000. The conventional pad arrangement 1000 comprises a substrate 1002 and pads 1004, which extend little or no distance beyond the bottoms 704 of the terminations 404 of the component 402. Due to processing variations, the component 402 sometimes can become cantilevered during reflow soldering by the solder 1006 surrounding one of the terminations 404. In such a cantilevered position the opposite termination 404 may not be able to contact the opposite solder 1008, and the attachment of the component 402 is rendered defective.

Figure 11:
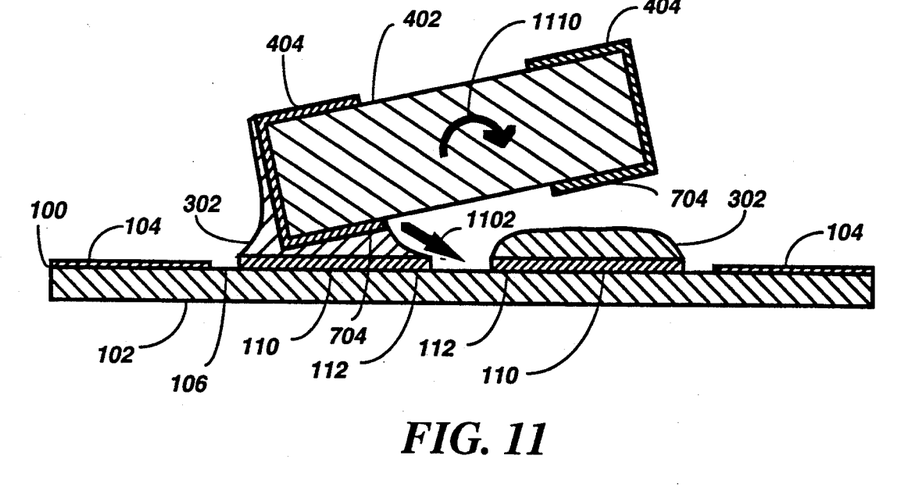
FIG. 11 is a side orthographic longitudinal cross-section view of the pad arrangement and a surface mount component depicting an anti-tombstoning force generated during reflow soldering in accordance with the preferred embodiment of the present invention.

Referring to FIG. 11, a side orthographic longitudinal cross-section view of the surface mount component 402 and the pad arrangement 100 in accordance with the preferred embodiment of the present invention depicts an anti-tombstoning force generated during reflow soldering. As solder moves onto the arcuate area 112 at the start of the reflow soldering process, a downward force 1102 between the termination 704 and the arcuate area 112 is generated by the movement and the resultant increased surface tension of the solder 302. The downward force 1102 tends to rotate the component 402 in the direction shown by the curved arrow 1110, thereby bringing the elevated termination bottom 704 downward and into contact with the solder 302. Once the bottoms 704 of both terminations 404 are in contact with the liquefied solder 302, alignment and attachment of the component to the pad arrangement 100 can proceed normally, as described herein above in reference to FIGS. 4-9.

Figure 12:
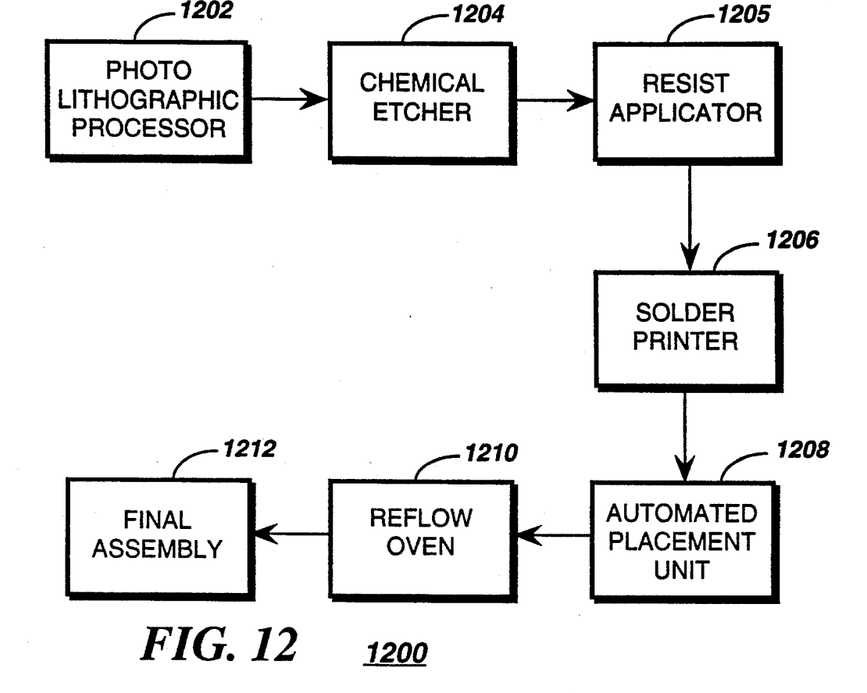
FIG. 12 is a block diagram of the preferred manufacturing process for mounting surface mount components in accordance with the preferred embodiment of the present invention.

Referring to FIG. 12, a block diagram of the preferred manufacturing process 1200 for mounting the surface mount component 402 in accordance with the preferred embodiment of the present invention shows a photo lithographic processor 1202. The photo lithographic processor 1202 is used to deposit patterns of a photo-imageable etch resist, such as Dupont Vacrel, onto the substrate 102. The substrate 102 is plated with a metal, such as one-half ounce copper, covered with, for example, a hot-air-solder-leveled tin-lead alloy, for use in forming circuit paths and the tri-oval pads 108. Next, the substrate 102 passes to a chemical etcher 1204 comprising an etchant such as ferric chloride for etching the metal plating not protected by the etch resist, thereby removing all the metal except for desired circuit paths and the tri-oval pads 108 to comprise a printed wiring board.

In a similar manner, the photo lithographic processor 1202 and the chemical etcher 1204 are used to make a stencil from a material such as stainless steel, the stencil having apertures matching the location, size, and shape of the elliptical areas 110 of the tri-oval pads 108. Then the substrate 102 moves to a resist applicator 1205, where the protective resist material is screened over the substrate, thermally cured, and then selectively removed from the tri-oval pads 108 and the pad surround areas 106.

Next, the substrate 102 and the stencil move to a solder printer 1206 where the apertures of the stencil are aligned with the elliptical areas 110 on the substrate 102, and the solder paste 202 is applied to the elliptical areas 110 through the stencil. After receiving the solder paste 202, the substrate 102 passes to an automated placement unit 1208 that places the surface mount components 402 on top of the solder paste 202 with the surface mount component terminations 404 approximately aligned over the elliptical areas 110 of the tri-oval pads 108, including the arcuate areas 112.

Next, the substrate 102 and surface mount components 402 pass into a reflow oven 1210 for liquefying the solder 302 in the solder paste 202. Preferably, the reflow oven has an inert atmosphere to control oxidation of materials while in the reflow oven. Once the solder 302 has become liquefied, the solder 302 "wets," i.e., covers uniformly and adheres to, the surface mount component terminations 404 and the tri-oval pads 108 (FIG. 1). While in the reflow oven 1210 the surface mount components 402 are allowed to move freely in response to forces generated by surface tension of the liquefied solder. A characteristic of the surface tension of a liquid is that the surface tension is directed towards minimizing the surface area of the liquid. This characteristic causes the tri-oval pads 108 and the surface mount component terminations 404 to interact with the surface tension of the liquefied solder 302 to pull the surface mount component terminations 404 into aligned positions with respect to the tri-oval pads 108 therefor, as is depicted in FIG. 6.

When the substrate 102 emerges from the reflow oven 1210, the solder 302 resolidifies, thus attaching the surface mount component terminations 404 to the tri-oval pads 108 in the aligned position achieved while in the reflow oven 1210. The alignment automatically provided during the preferred manufacturing process in accordance with the present invention is responsible for a reduction in attachment defect rate compared to conventional processes. It will be appreciated that similar processes and materials can be substituted for the processes and materials described above for the preferred embodiment of the present invention.

Figure 13:
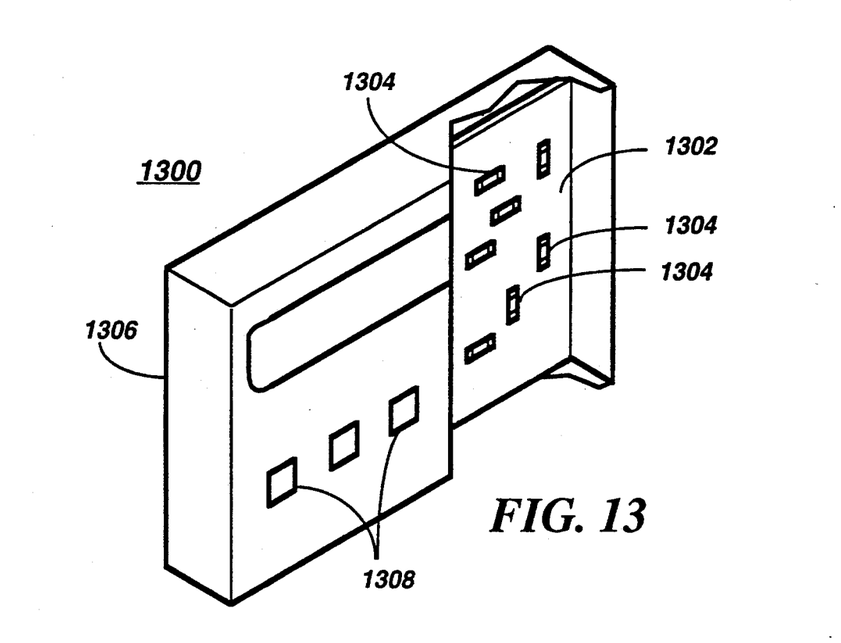
FIG. 13 is an isometric view of a selective call receiver constructed in accordance with the preferred embodiment of the present invention.

Referring to FIG. 13, an isometric view of a selective call receiver 1300 constructed in accordance with the preferred embodiment of the present invention depicts a printed wiring board 1302 and surface mount components 1304. The surface mount components are attached to tri-oval pads on the printed wiring board 1302 similar to the tri-oval pads 108 in accordance with the preferred embodiment of the present invention. The selective call receiver 1300 further comprises a housing 1306 for protecting circuitry contained therein, and user controls 1308 for control of the operation of the selective call receiver 1300.

Figure 14:
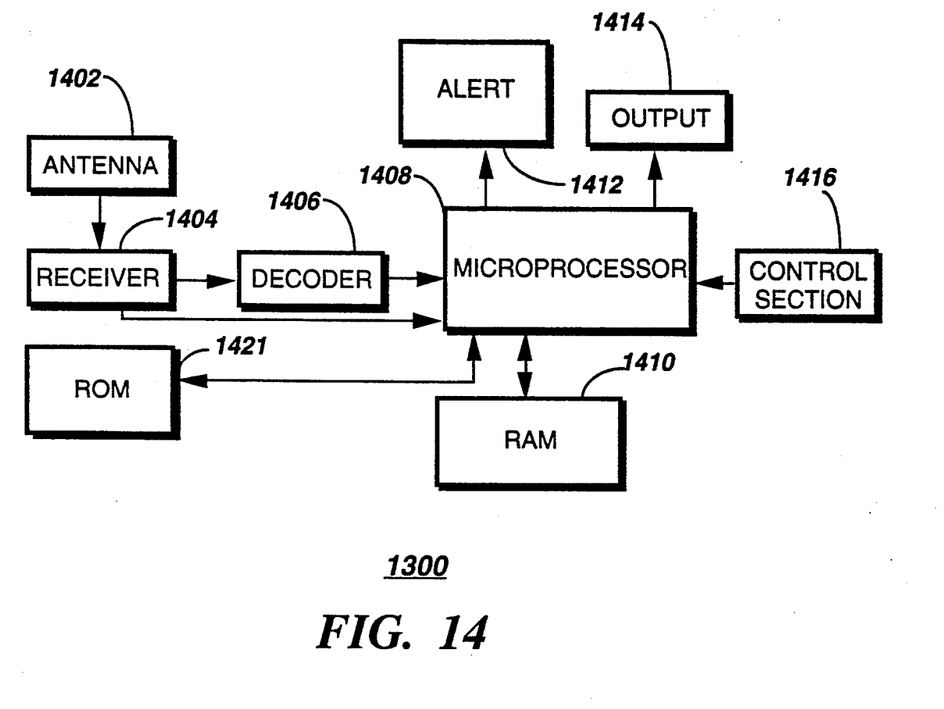
FIG. 14 is an electrical block diagram of the selective call receiver in accordance with the preferred embodiment of the present invention.

Referring to FIG. 14, an electrical block diagram of the selective call receiver 1300 in accordance with the preferred embodiment of the present invention comprises an antenna 1402 for intercepting RF signals. The antenna 1402 is coupled to a receiver 1404 for receiving and demodulating the RF signals intercepted. A decoder 1406 is coupled to the receiver 1404 for decoding a demodulated address transmitted in any of a number of wellknown signaling protocols, such as POCSAG or GSC selective call signaling. A microprocessor 1408, e.g., the MC68HC05C8 or C11 series microcomputers manufactured by Motorola, Inc. of Schaumburg, Ill., is also coupled to the receiver 1404 for processing the demodulated information. The microprocessor 1408 is responsive to the decoder 1406 and is coupled to a random access memory (RAM) 1410 for storing recovered information having an address assigned to the selective call receiver 1300. An alert generator 1412 is coupled to the microprocessor 1408 for providing an audible or tactile alert to a user when the microprocessor 1408 has a message ready for presentation.

An output device 1414 comprises a visual display or an audio transducer or both, the output device 1414 also being controlled by the microprocessor 1408. A control section 1416 comprises user accessible controls for allowing the user to command the microprocessor 1408 to perform the selective call receiver operations well known to one of ordinary skill in the art, and typically includes control switches such as an on/off control button, a function control, etc.

The microprocessor 1408 is coupled to a read-only memory (ROM) 1421 comprising operating system software for controlling the selective call receiver 1300. It will be appreciated that the functions of the decoder 1406, the RAM 1410, and the ROM 1421 may be incorporated into the microprocessor 1408 as well, as contiguous components thereof. It will be further appreciated that other types of non-volatile memory, e.g., programmable read-only memory (PROM) and electrically-erasable programmable read-only memory (EEPROM), may be used as well for the ROM 1421.

Thus, the present invention advantageously provides a better method and apparatus for aligning and attaching a surface mount component to a corresponding mounting pad arrangement. The present invention minimizes component misalignment and tombstoning, thereby reducing attachment defects compared to conventional methods and apparatus.

What is claimed is:

1. A method of aligning and attaching a leadless surface mount component comprising a termination at each end of the component, the termination having bottom and end portions for attaching to a corresponding pad on a substrate by a reflow process of liquefying and subsequently solidifying a conductive material positioned between the termination and the pad, the method comprising the steps of:

forming a pad arrangement comprising two opposite pads, each pad occupying a tri-oval-shaped area comprising:
an elliptical area substantially centered under the bottom portion of the corresponding termination of the component when the component is aligned with the pad arrangement; and
an arcuate area contiguous with the elliptical area and extending towards the opposite pad in a central lengthwise direction;
applying the conductive material to the elliptical area; and
thereafter performing the reflow process, whereby the conductive material liquefies and flows onto the arcuate area, thereby facilitating alignment of the component with the pad arrangement.

2. The method according to claim 1, wherein the forming step comprises the steps of:
screening a protective coating onto the substrate and pad arrangement after the forming step; and
thereafter removing the protective coating from the pads and from the substrate between and adjacent to the pads.

3. The method according to claim 1,
wherein the conductive material comprises a solder paste, and
wherein the applying step comprises the step of printing the solder paste onto the elliptical area.

4. The method according to claim 1, wherein the performing step comprises the steps of:
heating the conductive material to liquefy the conductive material, thereby enabling surface tension of the liquefied conductive material to pull the component into alignment with the pad arrangement; and
subsequently cooling the liquefied conductive material to solidify the conductive material, thereby attaching the component to the pad arrangement.

5. A method of increasing and directing surface tension utilized for aligning a leadless surface mount component comprising a termination at each end of the component, the termination having bottom and end portions for attaching to a corresponding pad on a substrate by a reflow process of liquefying and subsequently solidifying a conductive material positioned between the termination and the pad, the method comprising the steps of:

forming a pad arrangement having a center and comprising two opposite pads positioned on either side of the center, each pad occupying a tri-oval-shaped area comprising:
an elliptical area having a center substantially centered under the bottom portion of the corresponding termination of the component when the component is aligned with the pad arrangement; and
an arcuate area contiguous with the elliptical area and extending towards the opposite pad in a central lengthwise direction;
applying the conductive material to the elliptical area; and
thereafter performing the reflow process, whereby the conductive material liquefies and flows onto the arcuate area, losing thickness and thereby increasing the surface tension of the liquefied conductive material.

6. The method according to claim 5,
wherein the elliptical area has a first centroid, and
wherein the tri-oval-shaped area has a second centroid, the second centroid being positioned closer to the center of the pad arrangement than is the first centroid, and
wherein the conductive material has a third centroid, the third centroid being proximate the first centroid after the applying step and before the performing step, and
wherein the performing step comprises the step of moving the third centroid from proximate the first centroid to proximate the second centroid, thereby directing the surface tension of the liquefied conductive material towards the center of the pad arrangement.

7. The method according to claim 5, wherein the forming step comprises the steps of:
screening a protective coating onto the substrate and pad arrangement after the forming step; and
thereafter removing the protective coating from the pads and from the substrate between and adjacent to the pads.

8. The method according to claim 5,
wherein the conductive material comprises a solder paste, and
wherein the applying step comprises the step of printing the solder paste onto the elliptical area.

9. The method according to claim 5, wherein the performing step comprises the steps of:
heating the conductive material to liquefy the conductive material, thereby enabling surface tension of the liquefied conductive material to pull the component into alignment with the pad arrangement; and
subsequently cooling the liquefied conductive material to solidify the conductive material, thereby attaching the component to the pad arrangement.

10. A pad arrangement for aligning and attaching a leadless surface mount component comprising a termination at each end of the component, the termination having bottom and end portions, the pad arrangement for interconnecting the surface mount component with other circuitry, the pad arrangement comprising:
a substrate for supporting and interconnecting the surface mount component with the other circuitry; and
two opposite pads formed on the substrate and interconnected with the other circuitry, each pad occupying a tri-oval-shaped area comprising:
an elliptical area substantially centered under the bottom portion of the corresponding termination of the component when the component is aligned with the pad arrangement; and
an arcuate area contiguous with the elliptical area and extending towards the opposite pad in a central lengthwise direction; and
a conductive material applied to the elliptical area and thereafter reflowed onto the arcuate area, thereby facilitating alignment of the component with the pad arrangement.

11. The pad arrangement according to claim 10, further comprising a protective coating applied to the substrate, wherein the protective coating is absent from the pads and absent from the substrate between and adjacent to the pads.

12. The pad arrangement according to claim 10, wherein the conductive material comprises solder.

* * * * *